(12) United States Patent
Sun

(10) Patent No.: US 8,386,738 B1
(45) Date of Patent: Feb. 26, 2013

(54) OFF-CHIP NON-VOLATILE MEMORY ACCESS

(75) Inventor: Xiaodong Sun, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 575 days.

(21) Appl. No.: 12/612,615

(22) Filed: Nov. 4, 2009

Related U.S. Application Data

(60) Provisional application No. 61/111,950, filed on Nov. 6, 2008.

(51) Int. Cl.
*G06F 12/00* (2006.01)

(52) U.S. Cl. .............................. 711/167; 711/103; 713/1

(58) Field of Classification Search ................... 711/103, 711/167; 713/1
See application file for complete search history.

(56) References Cited

U.S. PATENT DOCUMENTS

| | | | | |
|---|---|---|---|---|
| 7,711,944 B2* | 5/2010 | Kwon | | 713/2 |
| 2005/0283598 A1* | 12/2005 | Gaskins et al. | | 713/2 |
| 2008/0235444 A1* | 9/2008 | Gower et al. | | 711/105 |

OTHER PUBLICATIONS

Open Nand Flash Interface Specification, Dec. 28, 2006, [online] [url=http://onfi.org/wp-content/uploads/2009/02/onfi_1_0_gold.pdf] retreived from internet Mar. 30, 2012, Revision 1.0.*
Open NAND Flash Interface (ONFI), "Open NAND Flash Interface Specification," Feb. 27, 2008, Revision 2.0, Retrieved from the Internet on Oct. 19, 2009 via http://www.onfi.org/, 174 pages.

* cited by examiner

*Primary Examiner* — Jared Rutz

(57) ABSTRACT

The present disclosure includes systems and techniques relating to non-volatile memory. Systems and techniques can include sending a sequence of data including an address to a non-volatile memory to request data and receiving data from the non-volatile memory. The data can include a first portion and a second, different portion. The systems and techniques can include determining, based at least on the first portion, whether the second portion includes valid access parameter information associated with the non-volatile memory.

20 Claims, 6 Drawing Sheets

OFF-CHIP NON-VOLATILE MEMORY ACCESS

CROSS REFERENCE TO RELATED APPLICATION

This application claims the benefit of the priority of U.S. Provisional Application Ser. No. 61/111,950, filed Nov. 6, 2008 and entitled "A Generic NAND Flash Access Method from ROM Code," the entire contents of which are hereby incorporated by reference.

BACKGROUND

The present disclosure describes systems and techniques relating to non-volatile memory.

Devices and systems can store or retrieve data using non-volatile memory such as flash memory. For example, a digital camera can store an image to non-volatile memory. In another example, a digital media player such as an MP3 player can read a digital audio file from non-volatile memory and play the contents of the audio file. Mobile devices such as a mobile phone or a personal digital assistant (PDA) can read data from and write data to one or more non-volatile memory.

Devices and systems can perform multiple operations on non-volatile memory such as reading and programming operations. Various types of programming operations can include writing and erasing data. Erasing data in such memory can include marking a data area as invalid or not programmed, or can include writing data to a data area to effect an erasure. Non-volatile memory such as flash memory can be divided into multiple data areas. Each data area can be individually addressed and accessed. Accordingly, an operation can include obtaining an address for one or more data areas or a portion of a data area. Also, a data area can be divided into individual bits or larger aggregate data units such as bytes.

SUMMARY

The present disclosure includes systems and techniques for accessing non-volatile memory structures.

Systems and techniques for accessing a non-volatile memory structure can include sending a sequence of data to a non-volatile memory and receiving data from the non-volatile memory in response to sending the sequence of data. The sequence of data can include an address. The data can include a first portion and a second, different portion. The systems and techniques can include determining, based at least on the first portion, whether the second portion includes valid access parameter information associated with the non-volatile memory.

These, and other implementations, can include one or more of the following features. The sequence can have a first number of address cycles. The address can be a first address. Implementations can include sending an additional sequence of data comprising a second address to the non-volatile memory to request data based on a lack of the valid access parameter information in the second portion, the additional sequence having a second, different number of address cycles; receiving additional data from the non-volatile memory in response to the additional sequence; and determining whether the additional received data includes the valid access parameter information associated with the non-volatile memory. Implementations can include generating the first address based on a first page size; and generating the second address based on a second, different page size. Implementations can include accessing the non-volatile memory based on the valid access parameter information. The first portion can include an indicator. Determining whether the second portion includes the valid access parameter information can include determining whether the indicator matches a known indicator associated with a presence of the valid access parameter information. Determining whether the second portion includes access parameter information can include using the first and second portions. The second portion can include (i) a page size, (ii) a number of address cycles required to specify a data address to the non-volatile memory, and (iii) a busy time in which the non-volatile memory handles a request to read or write data. Implementations can include using the valid access parameter information to retrieve boot code from the non-volatile memory.

The described systems and techniques can be implemented in electronic circuitry, computer hardware, firmware, software, or in combinations of them, such as structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, the disclosed embodiment(s) below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a mobile telephone, a personal digital assistant (PDA), a mobile computer, a digital camera), a general purpose data processing apparatus (e.g., a minicomputer, a server, a mainframe, a supercomputer), or combinations of these.

Thus, according to another aspect of the described systems and techniques, apparatuses and systems can include a memory interface to communicate with a non-volatile memory structure that is external to the integrated circuit; and processor electronics, in communication with the memory interface, configured to perform operations. The operations can include sending a sequence of data to the non-volatile memory structure to request data. The sequence of data can include an address. The operations can include receiving data from the non-volatile memory structure in response to sending the sequence of data. The received data can include a first portion and a second, different portion. The operations can include determining, based at least on the first portion, whether the second portion includes valid access parameter information associated with the non-volatile memory structure.

These, and other implementations, can include one or more of the following features. Implementations can include a read-only memory that stores processor instructions. The processor electronics can be configured to boot using first boot code residing on the read-only memory and retrieve second boot code from the non-volatile memory structure based on the valid access parameter information.

In another aspect, apparatuses and systems can include processor electronics, a random access memory coupled with the processor electronics; and a read only memory coupled with the processor electronics. The read only memory can embody boot code configured to cause the processor electronics to iteratively issue read commands to a non-volatile memory, using different read parameters, until a read result includes an indication of a successful read of the non-volatile memory. The boot code can be configured to cause the processor electronics to access the non-volatile memory, using one or more parameters included in the read result, to load additional code into the random access memory from the non-volatile memory, and to transfer control to the additional code.

These, and other implementations, can include one or more of the following features. The boot code can be configured to cause the processor electronics to iteratively issue the read commands to a predefined base address of the non-volatile memory. The boot code can be configured to cause the processor electronics to use different page sizes to iteratively probe the non-volatile memory. The boot code can be configured to cause the processor electronics to use different address lengths to iteratively probe the non-volatile memory.

The subject matter described in this specification can be implemented to realize one or more of the following potential advantages. Access parameters of a non-volatile memory device can be determined from the non-volatile memory device without prior knowledge of the specific access parameters associated with the non-volatile memory device. The described subject matter can enable a system-on-a-chip to store a generic flash memory access routine in a read-only memory, which can enable a system-on-a-chip to be manufactured without knowing the specifics of the type of a non-volatile memory device that will be placed in communication with the system-on-a-chip. Moreover, such a system-on-a-chip can be integrated with various different types of non-volatile memory devices.

Details of one or more implementations are set forth in the accompanying drawings and the description below. Other features, objects, and advantages may be apparent from the description and drawings, and from the claims.

DRAWING DESCRIPTIONS

Like reference symbols in the various drawings indicate like elements.

DETAILED DESCRIPTION

Figure 1:
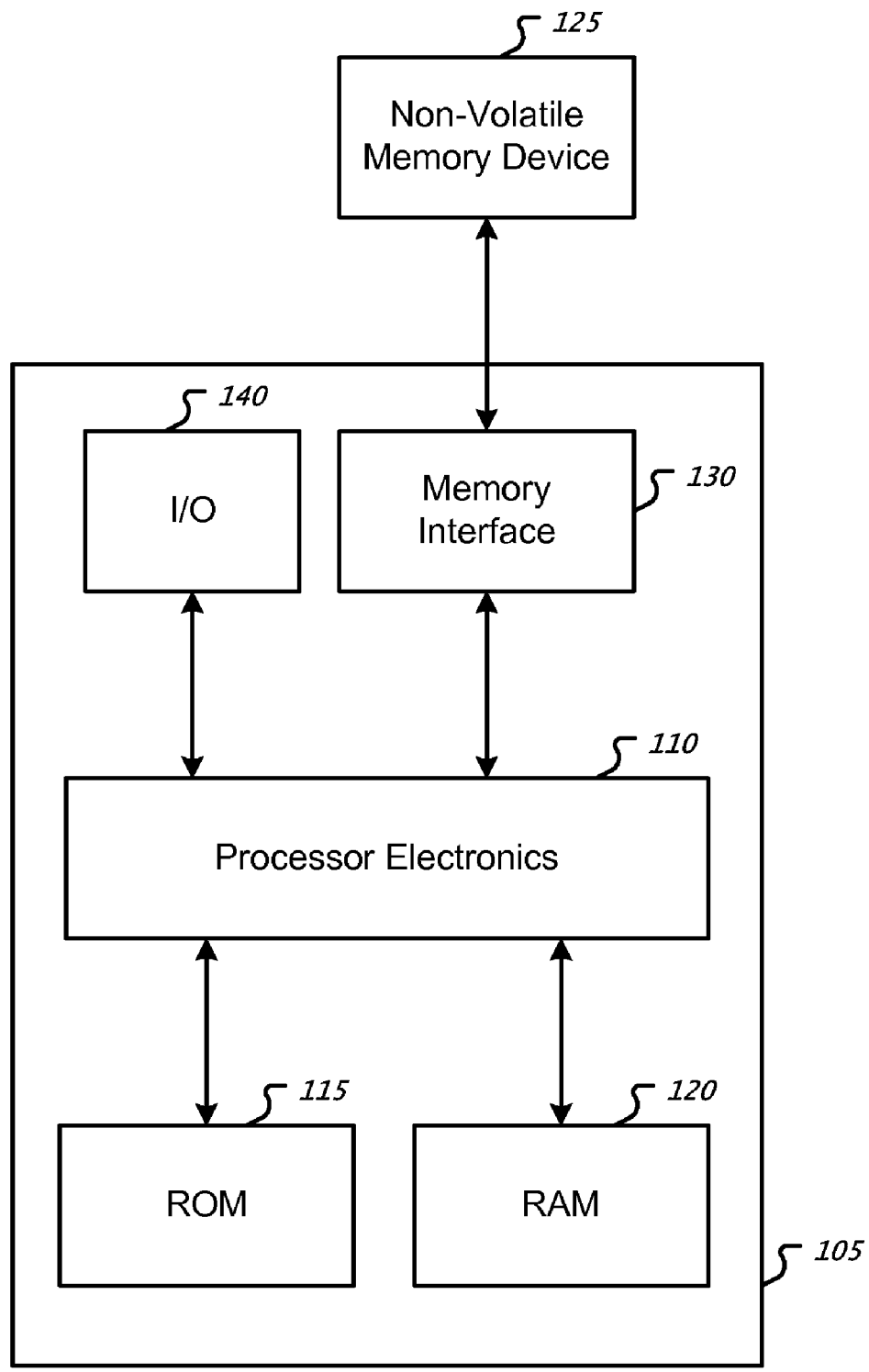
FIG. 1 shows an example of a system-on-a-chip communicatively coupled with a non-volatile memory device.

Apparatuses and systems such as ones including a System-on-a-Chip (SoC) architecture can communicate with one or more non-volatile memory structures such as flash memory structures. Various examples of flash memory structures include NAND flash memory structures and NOR flash memory structures. A SoC implementation can include an internal memory such as a Read-Only Memory (ROM) configured to store information such as initial boot code. In some implementations, the initial boot code directs processor electronics to access additional boot code from a different memory such as an external non-volatile memory device.

Non-volatile memory device specific information such as page size, number of address cycle, and busy time affects communications with a non-volatile memory device. This document describes, among other things, technologies for accessing non-volatile memory structures with different device specific parameters. The technologies include techniques that determine device specific information without exact knowledge of device specific information in advance. A SoC architecture that requires an external non-volatile memory structure may benefit from using one or more of the techniques presented herein. Processor instructions embodying such techniques are suitable for storage in a read-only memory. For example, the described technologies can be used to provide an off-chip flash device access from SoC on-chip ROM code without knowing device specific information in advance.

In some currently available technologies for accessing a flash device, some device specific information must be obtained from a device specification so that a flash device read or write command sequence can be built based on this information. One or more of the technologies described herein is based on reserving a data area within a non-volatile memory to store device information. In some implementations, the data area resides on a flash memory in an 8-byte chunk of memory located at a flash memory location 0x00. Different sizes and locations of the reserved data area are also possible. In any case, the data area can be burned with an indicator number and device specific information. The indicator number can be burnt into an on-chip ROM of a SoC before the SoC is integrated with a flash memory device that includes such a data area. One or more of the described technologies includes a read probing procedure configured to seek out and obtain the information in data areas that have been arranged in this fashion. After this information is obtained, future device specific read/write command sequence can be built to access the off-chip non-volatile memory device.

Boot code for an embedded system SoC can include multiple parts, such as first and second boot codes, that implement a staged and secured boot flow. In some implementations, a first part can include boot code running from the SoC's on-chip ROM, which can perform a security check, initialize memory control for random access memory (RAM) such as dynamic RAM (DRAM), and copy a second part of the boot code from an off-chip non-volatile memory device to the DRAM. After loading at least a portion of the second boot code from the off-chip device into the DRAM, the first boot code can perform a control flow jump to the second boot code. The second boot code can be larger than the first boot code. The second boot code can be compressed or encrypted and stored in an off-chip non-volatile memory device such as NAND flash, but then runs from an on-chip memory such as DRAM.

In such a dual-part boot-up sequence, one function of boot code includes accessing an off-chip memory to copy additional boot code to an on-chip memory. In some implementations, boot code is burned and stored in an on-chip ROM. It may not be feasible or possible to modify the contents of an on-chip ROM once the SoC chips are manufactured. A SoC can use a generic non-volatile memory device read function to access various brands of off-chip non-volatile memory devices.

FIG. 1 shows an example of a system-on-a-chip communicatively coupled with a non-volatile memory device. An integrated circuit such as a SoC 105 can perform one or more operations described herein. In this example, the SoC 105 is communicatively coupled with a non-volatile memory device 125 such as a flash memory device via a memory interface 130. In some implementations, a memory interface 130 includes logic to communicate with an off-chip memory device. In some implementations, a memory interface 130 is a communication pathway for on-chip areas on the SoC 105 to access off-chip devices. The non-volatile memory device 125 is external to the SoC 105. In some implementations, the non-volatile memory device 125 and SoC 105 are shipped as an integrated solution. For example, the non-volatile memory device 125 and SoC 105 can be affixed to a single printed circuit board. In some implementations, the non-volatile memory device 125 is located within a removable structure that mechanically and electrically couples with another structure that houses the SoC 105. The SoC 105 can include processor electronics 110. In some implementations, processor electronics 110 can include one or more processing regions. In some implementations, processor electronics 110 can include specialized processing logic.

The SoC 105 can include a ROM 115. The ROM 115 can store boot code which can include boot-up instructions for the processor electronics 110. Boot-up instructions can include instructions for communicating with a broad range of memory devices such as a non-volatile memory device 125. In some implementations, the non-volatile memory device 125 can include information such as additional boot code or application executables. In some implementations, processor electronics 110 transfer information from the non-volatile memory device 125 to a memory structure such as an internal memory, e.g., RAM 120, or an external memory during a boot-up sequence.

In some implementations, the SoC 105 can include input/output (I/O) channel(s) 140 for video/audio/image input, text input, positioning input, or video/audio/image output. In some implementations, the SoC 105 can include I/O channel(s) 140 for communications, e.g., wireless communication interface(s) and wired communication interface(s). Apparatuses such as digital media player, digital camera, personal data assistant (PDA), mobile phone, computer, or embedded device can include a SoC 105 for the apparatuses' control and processing requirements.

Processor electronics 110 can read from and/or write to the non-volatile memory device 125. For example, data received from an I/O channel 140 can be stored on the non-volatile storage device 125. In another example, content from a file retrieved from the non-volatile storage device 125 can be digitally reproduced as output on an I/O channel 140. In some implementations, a removable unit can contain the non-volatile memory device 125. In some implementations, a non-volatile memory device 125 can include a flash memory chip. In some implementations, a non-volatile memory device 125 can include a flash memory chip and controller circuitry.

A non-volatile memory device 125 can store data arranged in pages. A page includes a fixed amount of space for data, e.g., a fixed number of bytes. In some implementations, processor electronics 110 can access the non-volatile memory device 125 based on a page address and a page offset. The page offset can refer to a specific memory location with a page. In some implementations, processor electronics 110 can write data such as an entire page or a portion of a page to the non-volatile memory device 125, and in turn, a non-volatile memory device 125 can write data to a physical page, e.g., a grouping of memory cells.

Figure 2:
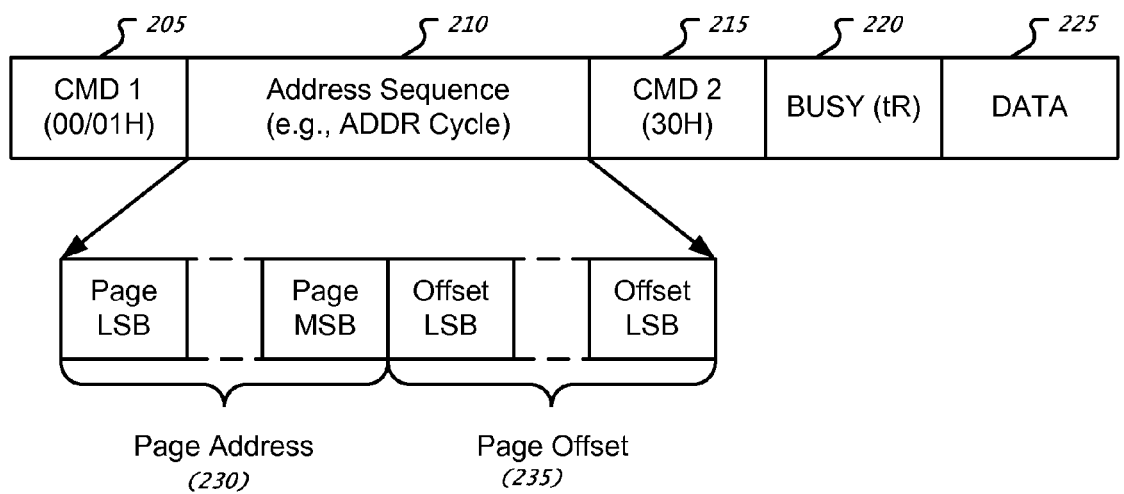
FIG. 2 shows an example of a read command sequence to access a flash memory device.

FIG. 2 shows an example of a read command sequence to access a flash memory device. A processing apparatus, such as a SoC 105, can send a command sequence to a non-volatile memory device to read or write data. A read command sequence can start with a read command (CMD1) 205. In some implementations, the read command 205 is either 0x00 or 0x01 depending on a page size. The read command sequence can include an address sequence 210 (e.g., ADDR Cycle) to identify a memory location. The address sequence 210 can include a sequence of bytes that specify the address for the read command sequence. A trailing command (CMD2) 215 may be required for devices with a page size larger than 512 bytes. After issuing the read command sequence to the flash memory device, a busy time (tR) 220 is typically required for the flash memory device to prepare the data 225. Different devices may have different busy times. Then, the data 225 is provided by the non-volatile memory device.

In some implementations, the length of the address sequence 210 is dependent on parameters such as page size and capacity of the device. For example, an address sequence 210 can include a page address 230 and a page offset 235. In some implementations, a page address 230 can include multiple bytes with the least significant byte (LSB) at a beginning position and the most significant byte (MSB) at an ending position. In some implementations, a page offset 235 can include multiple bytes with the LSB at a beginning position and the MSB at an ending position.

A SoC 105 can be configured for generic access to a wide variety of non-volatile memory devices. To assist the SoC 105 in determining access parameters of a memory device, the memory device can include device information. Device information can include an indicator number and access parameter information. Various examples of access parameters include page size, the number of address cycles expected by the memory device for an address sequence, and the time required by the device to respond to a command sequence, e.g., busy time. The indicator number can assist the SoC 105 in determining whether data received from a memory device includes valid access parameters. In some implementations, the SoC 105 can probe the memory device to obtain valid access parameters. For example, the SoC 105 can iterate through several read command sequences, which are generated based on different presumed values for one or more of the access parameters. In some implementations, a command sequence for a flash memory device can be based on the Open NAND Flash Interface (ONFI) Specification.

Figure 3:
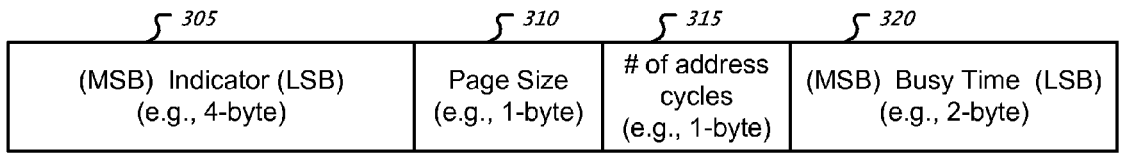
FIG. 3 shows an example of a memory layout for device information.

FIG. 3 shows an example of a memory layout for device information. A non-volatile memory device can store device information. In this example, device information includes an indicator field 305 and access parameter information. Access parameter information can include a page size field 310, the number of address cycles field 315, and a busy time field 320. In some implementations, device information occupies eights bytes with the indicator field 305 occupying four bytes, page size field 310 occupying one byte, the number of address cycles field 315 occupying one byte, and a busy time field 320 occupying two bytes. In some implementations, the device information is stored at a memory location of 0x00.

An indicator, such as one stored in an indicator field 305, can be used to verify a presence of access parameter information within a device information region of a non-volatile memory device. In some implementations, the indicator can be an indicator number to validate flash device specific parameter fields in a region of flash memory at location 0x00. In some implementations, an indicator field 305 is a four byte field to represent a unique indicator number, e.g., 0xD2ADA3F1. Such a unique indicator number can be established between various manufacturers such as non-volatile memory device manufacturers and SoC manufacturers. In some cases, an indicator number can be selected and agreed to by an industry group associated with the manufacturing of non-volatile memory devices. Selecting an indicator number can include generating a random number before the manufacturer of a non-volatile memory device as described herein. However, some values such as the value corresponding to all zeros and the value corresponding to all ones may be excluded from being the indicator number. In some implementations, an indicator field 305 stores a checksum value that corresponds to an output of a checksum function based on the input of the neighboring access parameter information.

A page size field 310 can indicate the page size that is used by the non-volatile memory device. For example, a zero value for the page size field 310 can indicate 512 bytes per page, a one can indicate 2,048 bytes per page, two can indicate 4,096 bytes per page, three can indicate 8,192 bytes per page, and four can indicate 16,384 bytes per page.

The number of address cycle field 315 can store the number of address cycles expected by the device. In some implementations, the non-volatile memory device expects that an address sequence of an associated read or write command will be communicated to the device over a specific number of address cycles. The number of address cycle field 315 can store this specific number. In some implementations, a minimum valid value for the number of address cycle field 315 is four, and a maximum valid value is seven.

A busy time field 320 can indicate the busy time (tR) of the non-volatile memory device. In some implementations, the busy time specifies a time period required by the device to process a read or write command.

A processing apparatus can use a probing mechanism to ascertain device information. The probing mechanism attempts to read device information stored on a memory device. The probing mechanism can iterate through one or more possible read command sequences and respectively issue the command sequences to a memory device. A given one of the probing read command sequences may or may not return data, and if it does return data, the returned data may or may not be valid. For example, some memory devices may return superfluous data based on receiving a probing read command sequence that is not valid or has an ambiguous interpretation from the memory device's standpoint.

In some implementations, if a probing read command sequence succeeds, then a read out position corresponding to an indicator number field is checked to ascertain whether the read operation was successful or not. In some implementations, if the indicator number in the read out matches a known value, the probing procedure is finished with the read out information deemed valid. Otherwise, the probing procedure generates and issues a different probing read command sequence to the memory device.

In some implementations, a probing procedure can assume a safe value for a memory device's busy time, e.g., busy time field value of 0xffff or, approximately, 64,000 microseconds. Once the probing procedure ascertains the device's actual busy time, a processing apparatus can use the actual busy time for future accesses of the memory device.

Figure 4:
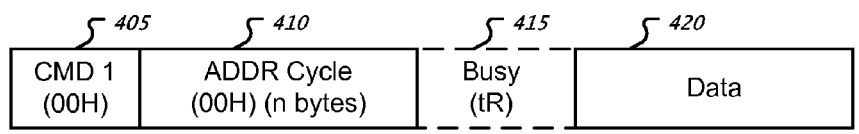
FIG. 4 shows an example of a read transaction based on a 512-byte page size.

FIG. 4 shows an example of a read transaction based on a 512-byte page size. Based on a 512-byte page size, there are four read command sequences, one for each different address cycle. A read command sequence based on a 512-byte page size, can include a command (CMD1) 405 and an ADDR Cycle 410. In this example, the ADDR Cycle 410 includes n-bytes of zeros, e.g., n-bytes of 00H, to access a memory at location 0x00. Following a time period, such as a busy time period 415, a memory device can return data 420. A processing apparatus can iterate through various lengths of zeros, e.g., various vales for n, to probe a memory device.

Figure 5:
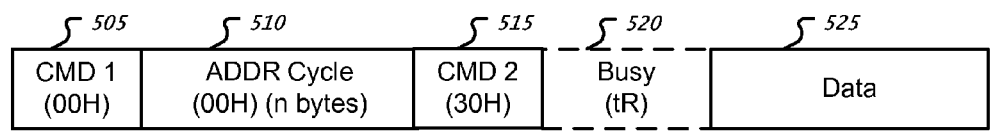
FIG. 5 shows an example of a read transaction based on a larger page size.

FIG. 5 shows an example of a read transaction based on a larger page size. Larger page sizes, such as page sizes larger than 512 bytes, can require a command sequence with two or more commands 505, 515. For such larger page sizes, there are four read command sequences in total, one for each address cycle. A read command sequence can include a first command (CMD1) 505, e.g., having a value of 00H, an ADDR cycle 510, and a second command (CMD2) 515, e.g., having a value of 30H. In this example, the ADDR Cycle 510 includes n-bytes of zeros, e.g., n-bytes of 00H, to access a memory at location 0x00. Following a time period, such as a busy time period 520, a memory device can return data 525. A processing apparatus can iterate through various lengths of zeros, e.g., various vales for n, to probe a memory device.

Figure 6:
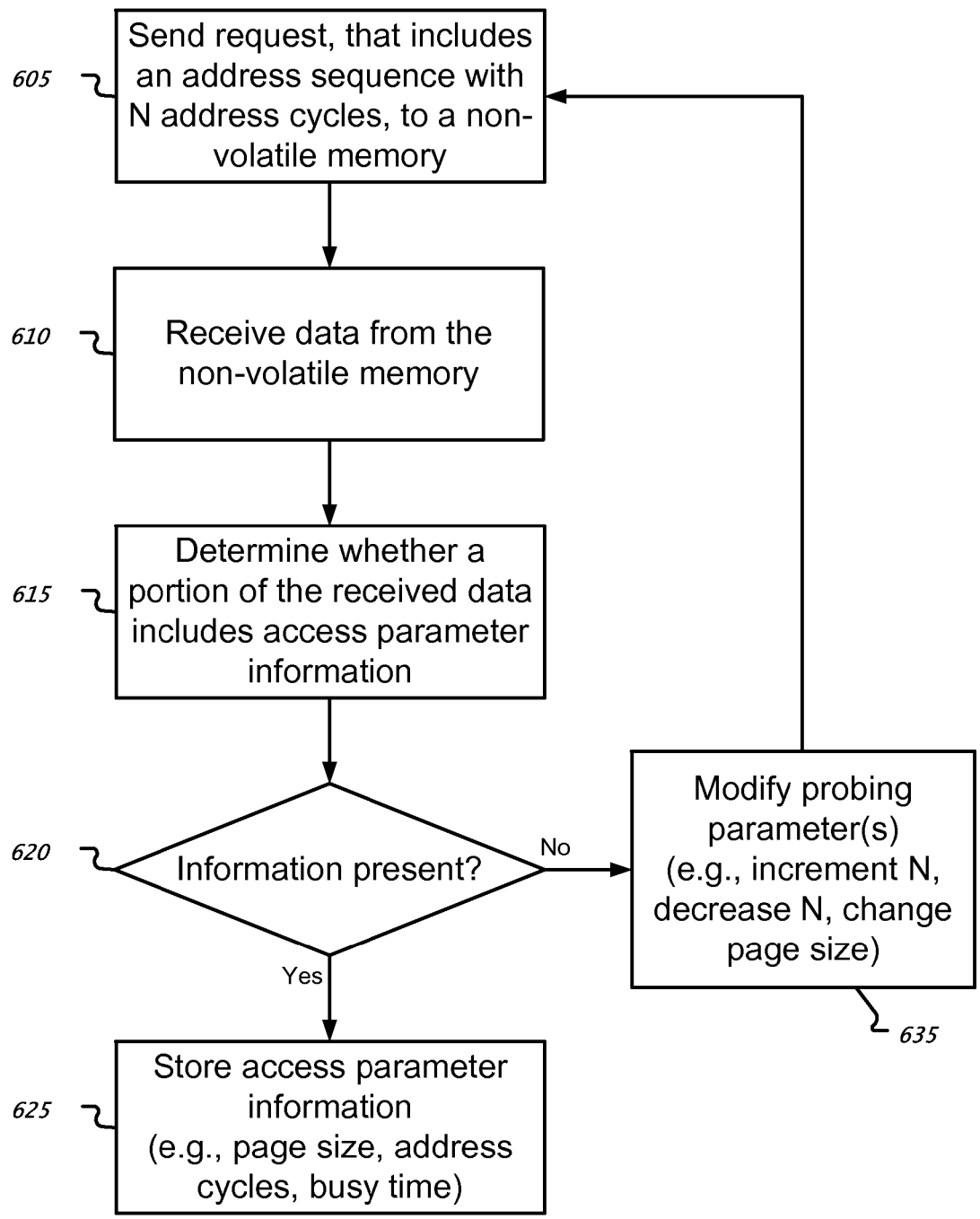
FIG. 6 shows an example of a non-volatile memory probing process.

FIG. 6 shows an example of a non-volatile memory probing process. Various processor electronics such as a SoC can execute a non-volatile memory probing process to determine access parameter information of a connected non-volatile memory such as a flash memory chip. A probing process can iterate through various combinations of probing parameters such as page size and number of address cycles.

At 605, a probing process can send a request to a non-volatile memory to retrieve data. The request can include one or more commands and an address sequence. The address sequence can include multiple address cycles, e.g., N address cycles.

At 610, the probing process can receive data from the non-volatile memory in response to the request. However, some non-volatile memory devices may not return data if they do not receive a specific number of bytes for an address sequence. Therefore, in some implementations, a probing process can set a timer such that a time out condition occurs when data are not returned. In such implementations, a time out condition can result in changing one or more probing parameters and probing the non-volatile memory again.

At 615, the probing process can determine whether a portion of the received data includes access parameter information. In some implementations, the probing process determines if a portion of the received data matches a known indicator number. If there is a match, then the received data is deemed to include access parameter information.

If, at 620, access parameter information is not present, then, at 635, the probing process can modify one or more probing parameters, e.g., incrementing N, decreasing N, or changing page sizes. In some implementations, at 635, the probing process can try various values for N before changing the page size. After one or more probing parameters are modified, the process continues at 605.

If, at 620, access parameter information is present, then, at 625, the probing process can store the access parameter information. In some implementations, access parameter information includes one or more of a page size, the number of address cycles recognized by the non-volatile memory, and a busy time value.

Figure 7:
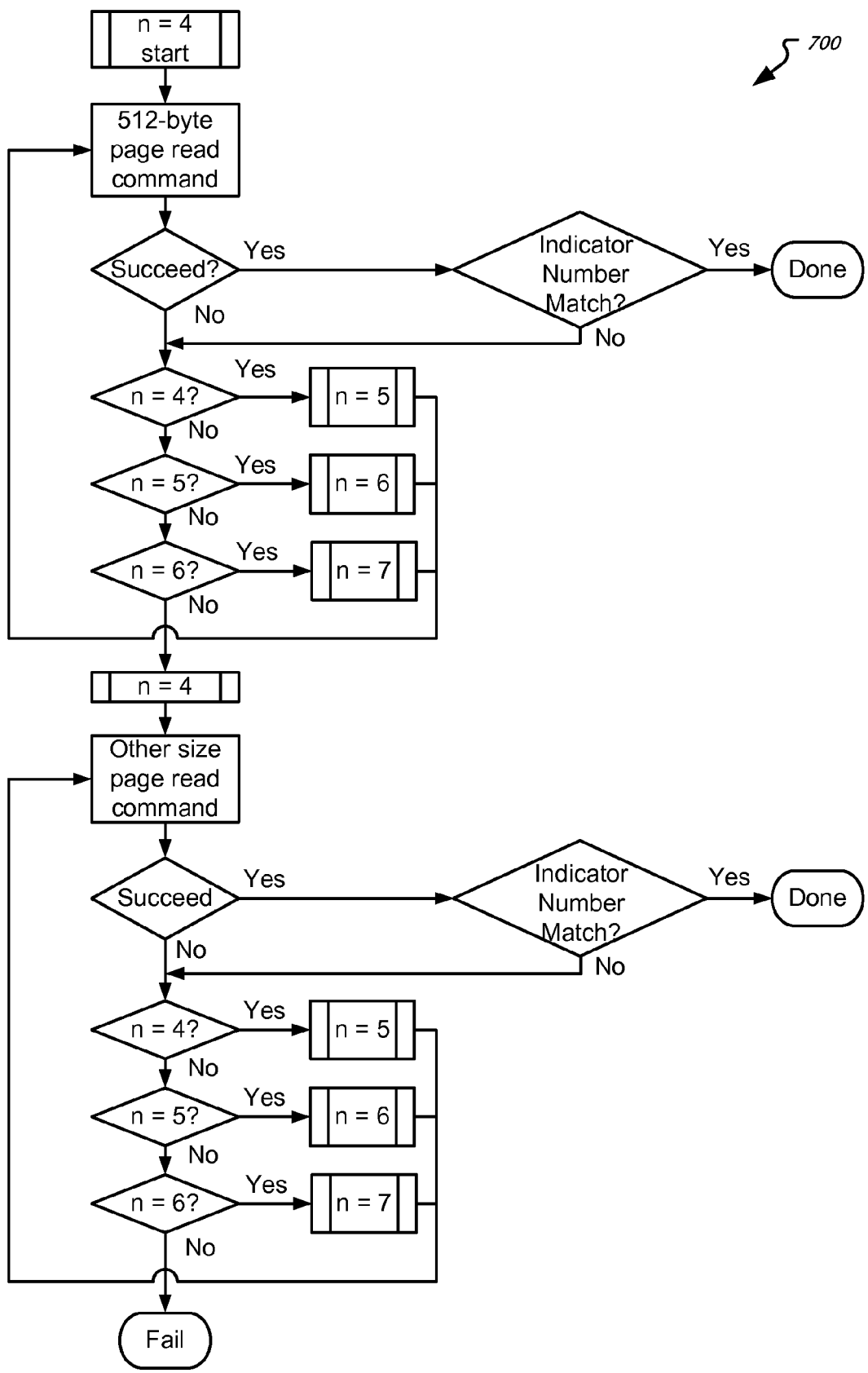
FIG. 7 shows another example of a non-volatile memory probing process.

FIG. 7 shows another example of a non-volatile memory probing process. A probing process 700 can iterate through various device parameter values in order to retrieve data from a flash memory. The probing process 700, for example, starts with the number of address cycles parameter set to four and the page size set to 512 bytes. Based on these initial parameters, the probing process 700 issues a read command to the flash memory. If the flash memory returns data, the probing process 700 checks to determine whether a portion of the returned data matches an expected value such as an indicator number. If the indicator number matches, the probing process 700 is finished. Otherwise, the probing process 700 iterates through additional values for the number of address cycles parameter.

If the probing process 700 reaches an upper limit for the number of address cycles parameter, e.g., eight, then the probing process 700 can modify the page size parameter and iterate through possible values for the number of address cycles parameter. For example, the probing process 700 resets the number of address cycles parameter to four and the page size is set to a different page size such as 1024 bytes or 2048 bytes. If the probing process 700 is able to find an indicator number match, then the probing process 700 finishes. Otherwise, the probing process 700 can continue to iterate through additional device parameter value combinations. If the set of possible value combinations becomes exhausted, the probing process 700 can return a failure indication.

Based on a success, the probing process 700 returns flash device specific information. With the returned information, a flash specific read or write command sequence can be built to access any memory address.

Figure 8:
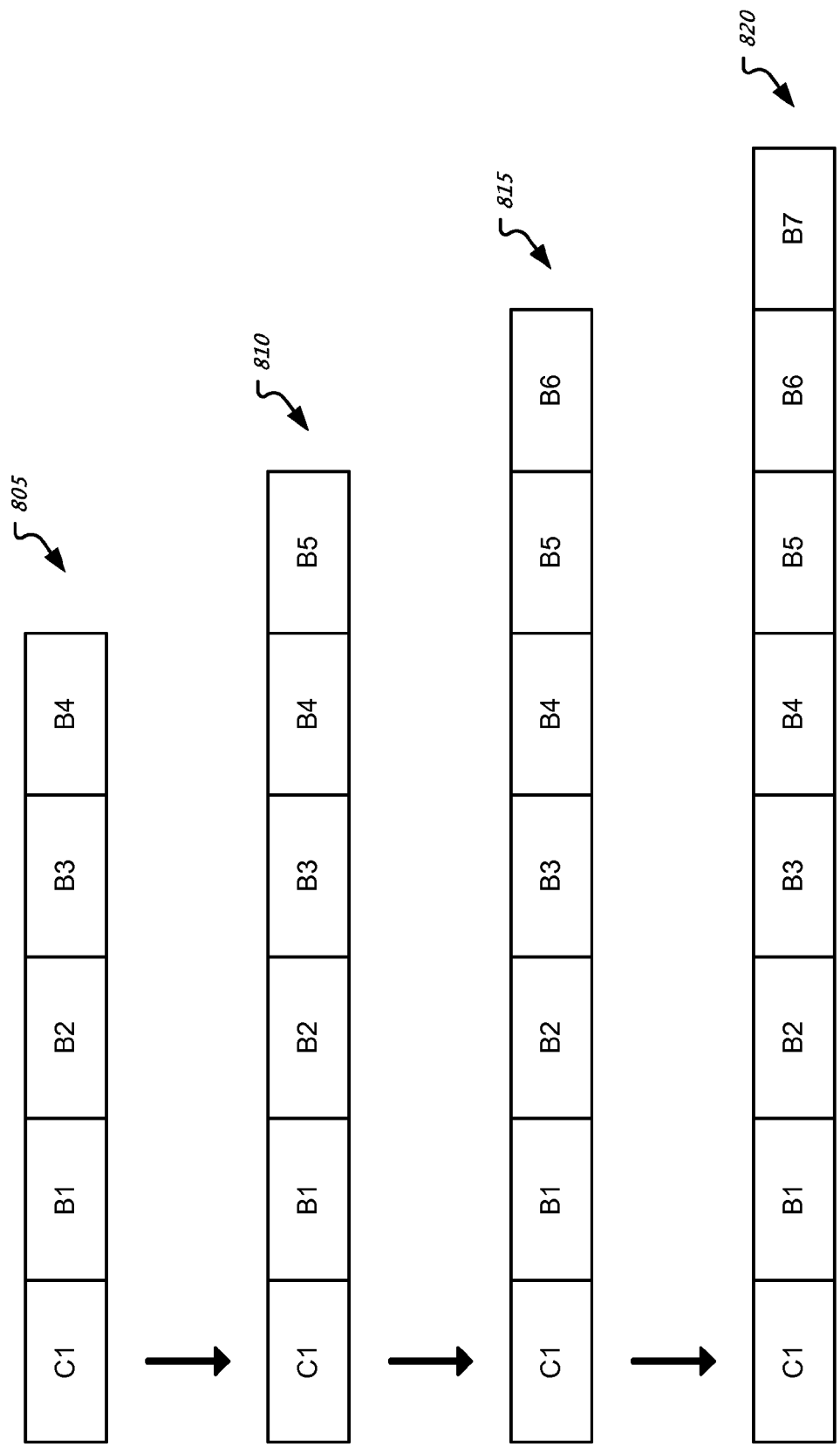
FIG. 8 shows an iterative example of different command sequences.

FIG. 8 shows an iterative example of different command sequences. A probing process can iterate through various byte lengths for an address sequence portion of a command sequence. For example, a probing process can issue a command sequence 805 that includes a command byte (C1), followed by four bytes (B1-B4) that form an address sequence. Based on a failure, the probing process can issue a different command sequence 810 that includes a command byte (C1), followed by five bytes (B1-B5) that form an address sequence. If needed, the probing process can issue one or more additional command sequences 815, 820 that include additional bytes in their respective address sequence portions (e.g., B6 and B6-B7 respectively). In some implementations, a probing process can use a different ordering of command sequences than the one shown in FIG. 8. In some implementations, a SoC can sequentially transmit each byte of an address sequence to a flash memory. A probing process can set the bytes in an address sequence to zero to attempt to access device information at a memory location of 0x00. Such a probing process can add additional zero valued bytes to build larger address sequences.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A method, comprising:
sending, to a non-volatile memory, a first sequence of data using one or more first probing parameters, the first sequence of data comprising a first address;
receiving data from the non-volatile memory in response to sending the first sequence of data, wherein the received data comprises a first portion and a second, different portion;
determining, based at least on the first portion, whether the second portion includes valid access parameter information associated with the non-volatile memory;
changing the one or more first probing parameters based on a lack of the valid access parameter information in the second portion to produce one or more second probing parameters; and
sending, using the one or more second probing parameters, a second sequence of data to the non-volatile memory to request data, the second sequence comprising a second address.

2. The method of claim 1, wherein the first sequence has a first number of address cycles that is defined by the one or more first probing parameters, wherein the second sequence has a second number of address cycles that is defined by the one or more second probing parameters, the second number being different from the first number, and wherein the first address and the second address are identical, the method further comprising:

receiving additional data from the non-volatile memory in response to the second sequence; and determining whether the additional received data includes the valid access parameter information associated with the non-volatile memory.

3. The method of claim 1, further comprising:
generating the first address based on a first page size; and
generating the second address based on a second, different page size.

4. The method of claim 1, further comprising:
accessing the non-volatile memory based on the valid access parameter information.

5. The method of claim 1, wherein the first portion comprises an indicator, wherein determining whether the second portion includes the valid access parameter information comprises determining whether the indicator matches a known indicator associated with a presence of the valid access parameter information.

6. The method of claim 1, wherein determining whether the second portion includes access parameter information comprises using the first and second portions.

7. The method of claim 1, wherein the second portion comprises (i) a page size, (ii) a number of address cycles required to specify a data address to the non-volatile memory, and (iii) a busy time in which the non-volatile memory handles a request to read or write data.

8. The method of claim 1, further comprising:
using the valid access parameter information to retrieve boot code from the non-volatile memory.

9. An integrated circuit, comprising:
a memory interface to communicate with a non-volatile memory structure that is external to the integrated circuit; and
processor electronics, in communication with the memory interface, configured to perform operations comprising:
sending a first sequence of data to the non-volatile memory structure to request data using one or more first probing parameters, the first sequence of data comprising a first address;
receiving data from the non-volatile memory structure in response to sending the first sequence of data, wherein the received data comprises a first portion and a second, different portion;
determining, based at least on the first portion, whether the second portion includes valid access parameter information associated with the non-volatile memory structure;
changing the one or more first probing parameters based on a lack of the valid access parameter information in the second portion to produce one or more second probing parameters; and
sending, using the one or more second probing parameters, a second sequence of data to the non-volatile memory to request data, the second sequence comprising a second address.

10. The integrated circuit of claim 9, further comprising:
a read-only memory that stores processor instructions, wherein the processor electronics are configured to (i) boot using first boot code residing on the read-only memory and (ii) retrieve second boot code from the non-volatile memory structure based on the valid access parameter information.

11. The integrated circuit of claim 9, wherein the first sequence has a first number of address cycles that is defined by the one or more first probing parameters, wherein the second sequence has a second number of address cycles that is defined by the one or more second probing parameters, the second number being different from the first number, wherein the first address and the second address are identical, and wherein the operations comprise:

receiving additional data from the non-volatile memory in response to the second sequence; and determining whether the additional received data includes the valid access parameter information associated with the non-volatile memory.

12. The integrated circuit of claim 9, wherein the operations comprise:
generating the first address based on a first page size; and
generating the second address based on a second, different page size.

13. The integrated circuit of claim 9, wherein the operations comprise:
accessing the non-volatile memory based on the valid access parameter information.

14. The integrated circuit of claim 9, wherein the first portion comprises an indicator, wherein determining whether the second portion includes the valid access parameter information comprises determining whether the indicator matches a known indicator associated with a presence of the valid access parameter information.

15. The integrated circuit of claim 9, wherein determining whether the second portion includes access parameter information comprises using the first and second portions.

16. The integrated circuit of claim 9, wherein the second portion comprises (i) a page size, (ii) a number of address cycles required to specify a data address to the non-volatile memory, and (iii) a busy time in which the non-volatile memory handles a request to read or write data.

17. The integrated circuit of claim 9, wherein the operations comprise:
using the valid access parameter information to retrieve boot code from the non-volatile memory.

18. A system comprising:
a memory interface to communicate with a non-volatile memory structure; and
circuitry, in communication with the memory interface, configured to (i) send a first sequence of data to the non-volatile memory structure to request data using one or more first probing parameters, the first sequence of data comprising a first address, (ii) receive data from the non-volatile memory structure in response to sending the first sequence of data, the received data comprising a first portion and a second, different portion, (iii) determine, based at least on the first portion, whether the second portion includes valid access parameter information associated with the non-volatile memory structure, (iv) change the one or more first probing parameters based on a lack of the valid access parameter information in the second portion to produce one or more second probing parameters, and (v) send, using the one or more second probing parameters, a second sequence of data to the non-volatile memory to request data, the second sequence comprising a second address.

19. The system of claim 18, further comprising:
a read-only memory that stores processor instructions, wherein the circuitry comprises processor electronics configured to (i) boot using first boot code residing on the read-only memory and (ii) retrieve second boot code from the non-volatile memory structure based on the valid access parameter information.

20. The system of claim 18, wherein the first sequence has a first number of address cycles that is defined by the one or more first probing parameters, wherein the second sequence has a second number of address cycles that is defined by the one or more second probing parameters, the second number being different from the first number, wherein the first address and the second address are identical, and wherein the circuitry is configured to (i) receive additional data from the non-volatile memory in response to the second sequence, and (ii) determine whether the additional received data includes the valid access parameter information associated with the non-volatile memory.

* * * * *